(12) United States Patent
Sugiyama et al.

(10) Patent No.: US 7,176,431 B2
(45) Date of Patent: Feb. 13, 2007

(54) OPTICAL SENSOR

(75) Inventors: Yukinobu Sugiyama, Hamamatsu (JP);
Seiichiro Mizuno, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/549,761

(22) PCT Filed: Feb. 10, 2004

(86) PCT No.: PCT/JP2004/001415

§ 371 (c)(1),
(2), (4) Date: Jun. 30, 2006

(87) PCT Pub. No.: WO2004/083774

PCT Pub. Date: Sep. 30, 2004

(65) Prior Publication Data

US 2006/0273238 A1    Dec. 7, 2006

(30) Foreign Application Priority Data

Mar. 20, 2003   (JP)   ............................. 2003-078624

(51) Int. Cl.
*H01L 27/00*   (2006.01)
(52) U.S. Cl. .................. 250/208.1; 250/214 R
(58) Field of Classification Search ............. 250/208.1, 250/214 R; 330/302, 308
See application file for complete search history.

(56) References Cited

U.S. PATENT DOCUMENTS

2004/0263652 A1 * 12/2004 Oda ........................... 348/272

FOREIGN PATENT DOCUMENTS

| JP | 01-167769 | 7/1989 |
|----|-----------|--------|
| JP | 5-29594 | 2/1993 |
| JP | 6-5832 | 1/1994 |
| WO | WO 03/055201 | 7/2003 |

* cited by examiner

*Primary Examiner*—John R. Lee

(74) *Attorney, Agent, or Firm*—Drinker Biddle & Reath LLP

(57) ABSTRACT

A signal processing circuit 20 has switches 21, a shift register 22, and an integrating circuit 23, and outputs voltages $V_{out}$ indicating luminance profiles in a second direction and in a first direction of light incident to a photosensitive region 10. The switches 21 are provided corresponding to groups of photosensitive portions on one side electrically connected among a plurality of pixels arrayed in the first direction and corresponding to groups of photosensitive portions on another side electrically connected among a plurality of pixels arrayed in the second direction. The shift register 22 is an element for sequentially reading electric currents from the groups of photosensitive portions on one side in the second direction and for sequentially reading electric currents from the groups of photosensitive portions on another side in the first direction. The integrating circuit 23 sequentially imports the electric currents from the groups of photosensitive portions on one side and the groups of photosensitive portions on another side sequentially read by the shift register 22, and converts the electric currents into voltages.

6 Claims, 15 Drawing Sheets

OPTICAL SENSOR

TECHNICAL FIELD

The present invention relates to a photodetector for detecting a two-dimensional position where light is incident.

BACKGROUND ART

Generally, in a known photodetector, image data obtained by imaging is taken into an image memory and then two-dimensional positions are detected after image processing, by the use of a solid-state image sensing device such as a MOS image sensor (see for example, Patent Document 1).

[Patent Document 1] Japanese Patent Application Laid-Open No. 01-167769

DISCLOSURE OF THE INVENTION

In the above-described known art, however, an image memory is required for storing the obtained image data, which causes a complicated structure of the device. Besides, since two-dimensional positions are detected by an operation process after storing the image data into the image memory, a detecting process of the two-dimensional positions takes time.

The present invention has been accomplished in view of the above respect and an object of the invention is to provide a photodetector capable of achieving increase in the speed of the detecting process of two-dimensional position and simplification of the structure.

In order to achieve the above object, a photodetector according to the present invention is a photodetector having a photosensitive region in which pixels are arranged in a two-dimensional array, wherein each pixel is constructed of a plurality of photosensitive portions each of which outputs an electric current according to an intensity of incident light and which are arranged adjacent to each other within an identical plane, wherein across a plurality of pixels arrayed in a first direction in the two-dimensional array, photosensitive portions on one side out of the plurality of photosensitive portions forming each of the pixels are electrically connected to each other, wherein across a plurality of pixels arrayed in a second direction in the two-dimensional array, photosensitive portions on another side out of the plurality of photosensitive portions forming each of the pixels are electrically connected to each other, the photodetector comprising a signal processing circuit for reading electric currents from groups of photosensitive portions on the one side electrically connected among the plurality of pixels arrayed in the first direction and electric currents from groups of photosensitive portions on the another side electrically connected among the plurality of pixels arrayed in the second direction, and for detecting luminance profiles in the first direction and in the second direction in the two-dimensional array on the basis of the electric currents.

In the photodetector according to the present invention, light incident to one pixel is detected in each of a plurality of photosensitive portions forming the pixel and an electric current according to an intensity of the light is outputted from each photosensitive portion. Since the photosensitive portions on the one side are electrically connected to each other across a plurality of pixels arrayed in the first direction in the two-dimensional array, the electric currents from the photosensitive portions on the one side are fed in the first direction. Since the photosensitive portions on the another side are electrically connected to each other across a plurality of pixels arrayed in the second direction in the two-dimensional array, the electric currents from the photosensitive portions on the another side are fed in the second direction. Since the electric currents from the photosensitive portions on the one side are fed in the first direction while the electric currents from the photosensitive portions on the another side are fed in the second direction, it becomes feasible to obtain the luminance profiles in the first direction and the luminance profiles in the second direction independently of each other. As a result, the two-dimensional position of incident light can be quickly detected by the extremely simple configuration wherein a plurality of photosensitive portions are arranged in each pixel.

In the present invention, one signal processing circuit detects each of the luminance profiles in the first direction and the luminance profiles in the second direction. Since the common circuit is used as a circuit for processing the electric currents from the groups of photosensitive portions on the one side and as a circuit for processing the electric currents from the groups of photosensitive portions on the another side, the circuit area can be reduced, so as to achieve cost reduction.

Preferably, the signal processing circuit comprises: a shift register for sequentially reading the electric currents from the groups of photosensitive portions on the one side, in the second direction and for sequentially reading the electric currents from the groups of photosensitive portions on the another side, in the first direction; and an integrating circuit for sequentially importing the electric currents from the groups of photosensitive portions on the one side and the electric currents from the groups of photosensitive portions on the another side sequentially read by the shift register, and for converting the electric currents into voltages. When the apparatus is constructed in this manner, it can obtain the luminance profiles in the first direction and the luminance profiles in the second direction by the extremely simple configuration.

Preferably, the signal processing circuit comprises: integrating circuits provided corresponding to the groups of photosensitive portions on the one side and the groups of photosensitive portions on the another side, each of which converts either of an electric current from a corresponding group of photosensitive portions on the one side and an electric current from a corresponding group of photosensitive portions on the another side, into a voltage, and outputs the voltage; CDS circuits provided corresponding to the integrating circuits, each of which outputs a voltage according to a variation amount of the voltage outputted from a corresponding integrating circuit; sample-and-hold circuits provided corresponding to the CDS circuits, each of which holds a voltage outputted from a corresponding CDS circuit and outputs the voltage; and a maximum detecting circuit for detecting a maximum of voltages outputted from the respective sample-and-hold circuits; and an A/D converter circuit for sequentially importing the voltages outputted from the respective sample-and-hold circuits, converting the voltages into digital values on the basis of the maximum detected by the maximum detecting circuit, and outputting the digital values. When the apparatus is constructed in this manner, the CDS circuits eliminate noise error even if each of the integrating circuits has different noise variations depending upon integrating operations. In addition, the apparatus can provide excellent resolution of A/D conversion not only at high intensities of light incident to the photosensitive portions, but also at low intensities of light. In consequence, the apparatus is able to obtain the luminance profiles in the first direction and the luminance profiles in the second direction with high accuracy.

Another photodetector according to the present invention is a photodetector having a photosensitive region, wherein the photosensitive region comprises a plurality of first photosensitive portions electrically connected to each other in a first direction and a plurality of second photosensitive portions electrically connected in a second direction intersecting with the first direction, wherein the plurality of first photosensitive portions and the plurality of second photosensitive portions are arrayed in a two-dimensionally mixed state within an identical plane, and the photodetector comprising a signal processing circuit for reading electric currents from groups of first photosensitive portions electrically connected to each other in the first direction and electric currents from groups of second photosensitive portions electrically connected to each other in the second direction, and for detecting luminance profiles in the first direction and in the second direction in the two-dimensional array on the basis of the electric currents.

In the photodetector according to the present invention, light incident to the photosensitive region is detected in any one of the first photosensitive portions and the second photosensitive portions, and an electric current according to an intensity of the light is outputted from each photosensitive portion. Since the first photosensitive portions are electrically connected to each other in the first direction, the electric currents from the first photosensitive portions are fed in the first direction. Since the second photosensitive portions are electrically connected to each other in the second direction, the electric currents from the second photosensitive portions are fed in the second direction. Since the electric currents from the first photosensitive portions are fed in the first direction while the electric currents from the second photosensitive portions are fed in the second direction as described above, it becomes feasible to obtain the luminance profiles in the first direction and the luminance profiles in the second direction independently of each other. As a result, the apparatus is able to quickly detect the two-dimensional position of incident light by the extremely simple configuration wherein the plurality of first photosensitive portions and the plurality of second photosensitive portions are arrayed in the two-dimensionally mixed state in an identical plane.

In the present invention, one signal processing circuit detects each of the luminance profiles in the first direction and the luminance profiles in the second direction. Since the common circuit is used as a circuit for processing the electric currents from the groups of first photosensitive portions and as a circuit for processing the electric currents from the groups of second photosensitive portions, the circuit area can be reduced, so as to achieve cost reduction.

Preferably, the signal processing circuit comprises: a shift register for sequentially reading the electric currents from the groups of first photosensitive portions in the second direction and for sequentially reading the electric currents from the groups of second photosensitive portions in the first direction; and an integrating circuit for sequentially importing the electric currents from the respective groups of first photosensitive portions and the electric currents from the respective groups of second photosensitive portions sequentially read by the shift register, and for converting the electric currents into voltages. When the apparatus is constructed in this manner, the apparatus is able to obtain the luminance profiles in the first direction and the luminance profiles in the second direction by the extremely simple configuration.

Preferably, the signal processing circuit comprises: integrating circuits provided corresponding to the groups of first photosensitive portions and the groups of second photosensitive portions, each of which converts either of an electric current from a corresponding group of first photosensitive portions and an electric current from a corresponding group of second photosensitive portions, into a voltage, and outputs the voltage; CDS circuits provided corresponding to the integrating circuits, each of which outputs a voltage according to a variation amount of the voltage outputted from a corresponding integrating circuit; sample-and-hold circuits provided corresponding to the CDS circuits, each of which holds a voltage outputted from a corresponding CDS circuit and outputs the voltage; a maximum detecting circuit for detecting a maximum of voltages outputted from the respective sample-and-hold circuits; and an A/D converter circuit for sequentially importing the voltages outputted from the respective sample-and-hold circuits, converting the voltages into digital values on the basis of the maximum detected by the maximum detecting circuit, and outputting the digital values. When the apparatus is constructed in this manner, the CDS circuits eliminate noise error even if each of the integrating circuits has different noise variations depending upon integrating operations. In addition, the apparatus can provide excellent resolution of A/D conversion not only at high intensities of light incident to the photosensitive portions, but also at low intensities of light. In consequence, the apparatus is able to obtain the luminance profiles in the first direction and the luminance profiles in the second direction with high accuracy.

BEST MODE FOR CARRYING OUT THE INVENTION

The photodetector according to an embodiment of the present invention will be described with reference to the drawings. The same elements, or elements with the same functionality will be denoted by the same reference symbols in the description, without redundant description. In the description hereinafter, parameters M and N are integers of not less than 2. Unless otherwise stated in particular, parameter m denotes an arbitrary integer of not less than 1 nor more than M, and parameter n an arbitrary integer of not less than 1 nor more than N.

Figure 1:
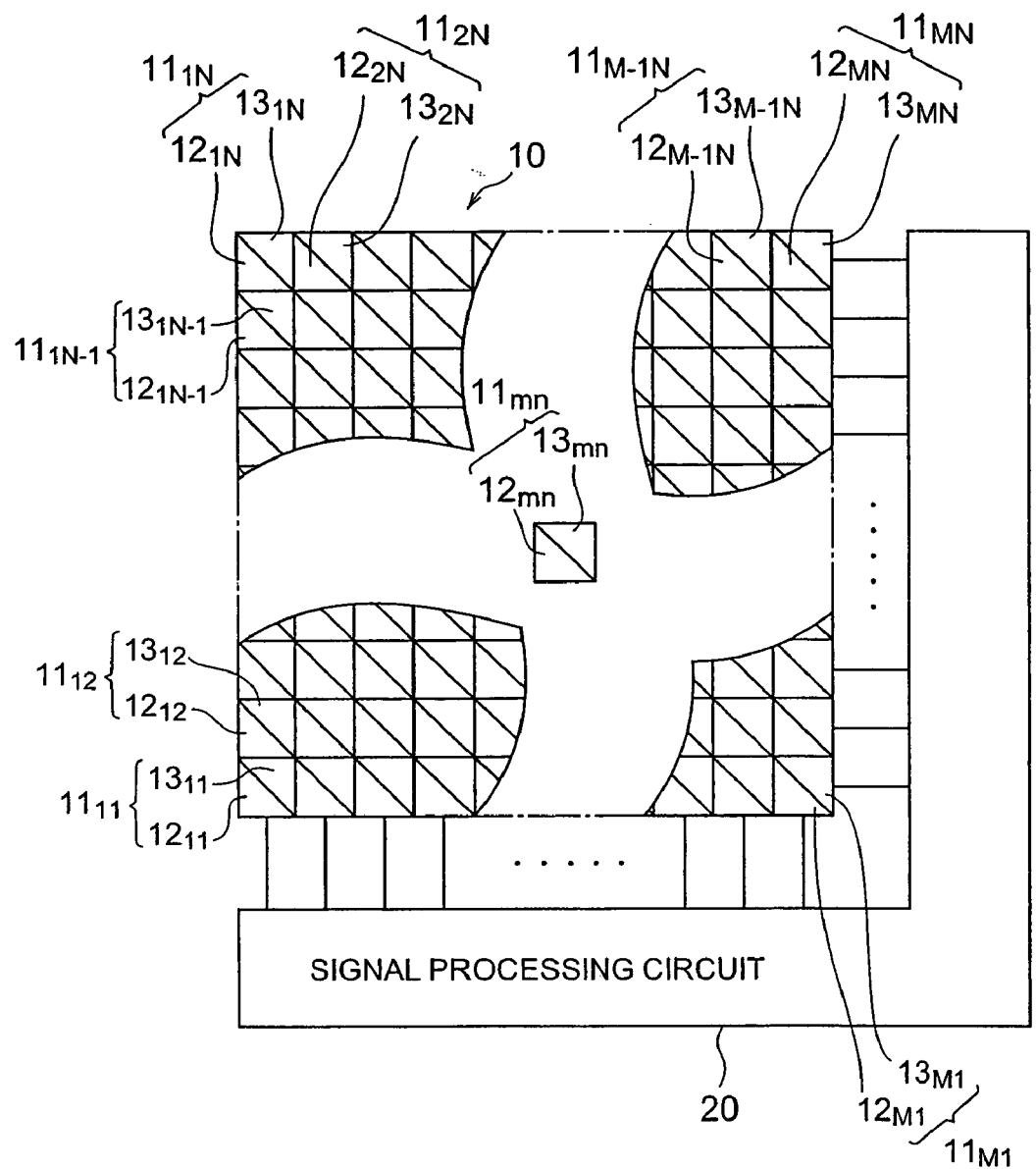
FIG. 1 is a schematic configuration diagram showing a photodetector according to an embodiment of the present invention.

FIG. 1 is a schematic configuration diagram showing the photodetector according to the present embodiment. The photodetector 1 of the present embodiment has a photosensitive region 10 and a signal processing circuit 20, as shown in FIG. 1.

The photosensitive region 10 consists of pixels $11_{mn}$ which are two-dimensionally arrayed in a matrix of N rows and M columns. Each pixel is composed of a photosensitive portion $12_{mn}$ (first photosensitive portion) and a photosensitive portion $13_{mn}$ (second photosensitive portion) each of which outputs an electric current according to an intensity of incident light and which are arranged adjacent to each other in an identical plane. In this configuration, photosensitive portions $12_{mn}$ and photosensitive portions $13_{mn}$ are arrayed in a two-dimensionally mixed state in an identical plane in the photosensitive region 10.

Across a plurality of pixels $11_{11}$–$11_{1N}$, $11_{21}$–$11_{2N}$, . . . , $11_{M1}$–$11_{MN}$ arrayed in a first direction in the two-dimensional array, photosensitive portions $12_{mn}$ on one side (e.g., photosensitive portions $12_{11}$–$12_{1N}$ on one side) out of the plurality of photosensitive portions $12_{mn}$, $13_{mn}$ forming the respective pixels $11_{mn}$ are electrically connected to each other. Across a plurality of pixels $11_{11}$–$11_{M1}$, $11_{12}$–$11_{M2}$, . . . , $11_{1N}$–$11_{MN}$ arrayed in a second direction in the two-dimensional array, photosensitive portions $13_{mn}$ on the other side (e.g., photosensitive portions $13_{11}$–$13_{M1}$ on the other side) out of the plurality of photosensitive portions $12_{mn}$, $13_{mn}$ forming the respective pixels $11_{mn}$ are electrically connected to each other.

Figure 2:
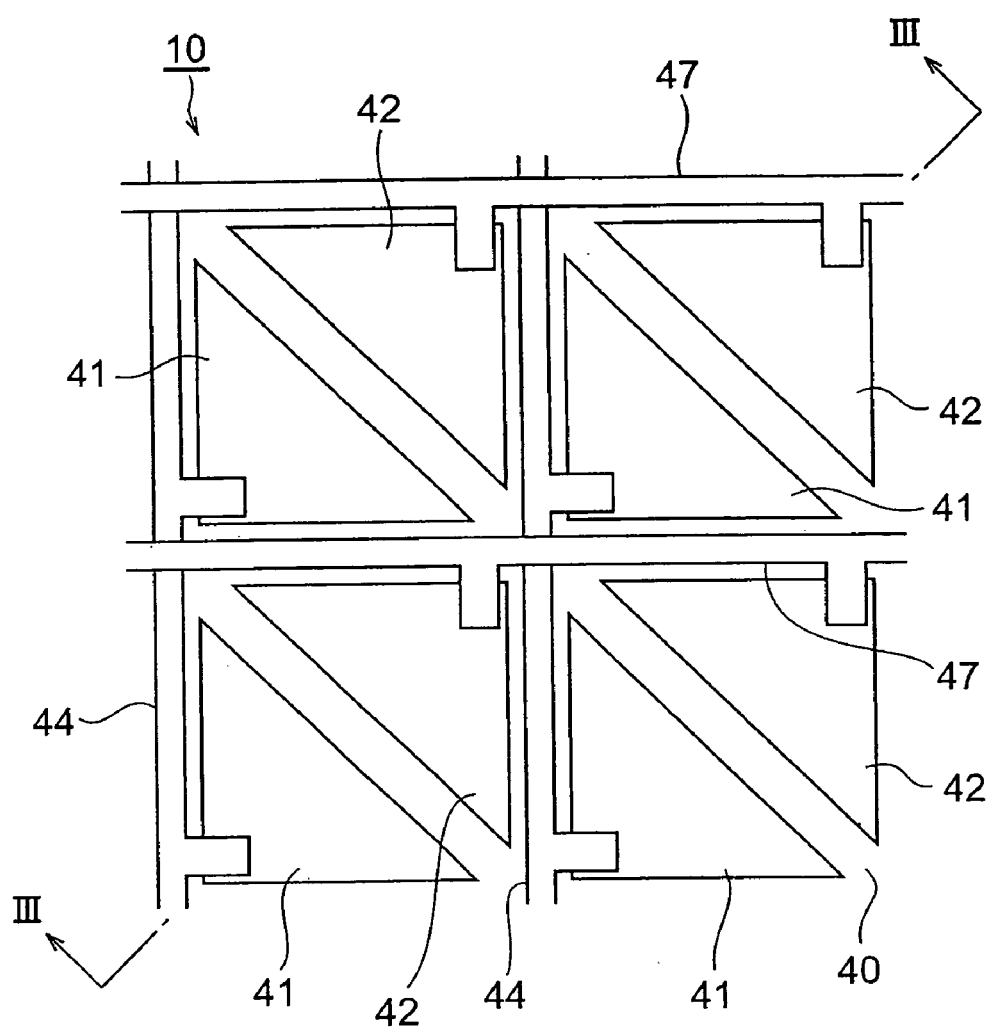
FIG. 2 is an enlarged plan view of major part showing an example of a photosensitive region included in the photodetector according to the embodiment of the present invention.
Figure 3:
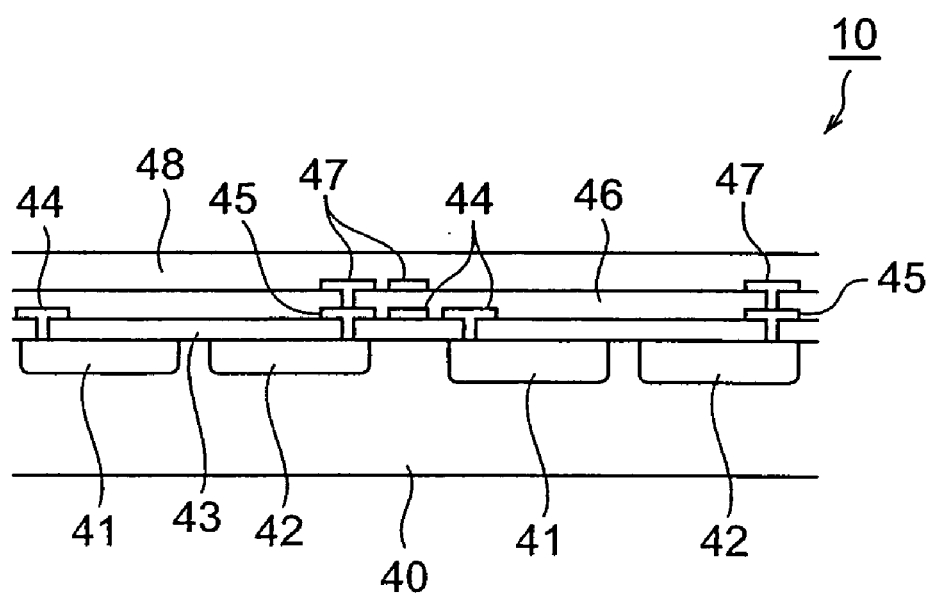
FIG. 3 is a sectional view along line II—II in FIG. 2.

The configuration of the photosensitive region 10 will be described below on the basis of FIGS. 2 and 3. FIG. 2 is an enlarged plan view of major part showing an example of the photosensitive region included in the photodetector, and FIG. 3 a sectional view along line III—III in FIG. 2. FIG. 2 is illustrated without illustration of protective layer 48.

The photosensitive region 10 includes a semiconductor substrate 40 made of a p-type (first conductivity type) semiconductor, and n-type (second conductivity type) semiconductor regions 41, 42 formed in the surface layer of the semiconductor substrate 40. In this configuration, each pair of photosensitive portions $12_{mn}$, $13_{mn}$ include a part of semiconductor substrate 40 and a set of second conductivity type semiconductor regions 41, 42, thereby forming photodiodes. As shown in FIG. 2, the second conductivity type semiconductor regions 41, 42 are of approximately triangular shape, when viewed from the light-incident direction, and each pixel consists of two regions 41, 42 adjacent on one side to each other. The semiconductor substrate 40 is kept at the ground potential. The photosensitive region 10 may also be comprised of a semiconductor substrate made of an n-type semiconductor, and p-type semiconductor regions formed in the surface layer of the semiconductor substrate. As seen from FIG. 2, regions 41 (photosensitive portions $12_{mn}$) and regions 42 (photosensitive portions $13_{mn}$) are alternately arrayed both in the first direction and in the second direction. In addition, the regions 41 (photosensitive portions $12_{mn}$) and the regions 42 (photosensitive portions $13_{mn}$) are also alternately arrayed both in a third direction intersecting with the first direction and with the second direction (e.g., a direction intersecting at 45°) and in a fourth direction similarly intersecting with the first direction and with the second direction (e.g., a direction intersecting at 45°).

A first insulating layer 43 is formed on the semiconductor substrate 40 and the regions 41, 42, and first wirings 44 are electrically connected to regions 41 on one side through contact holes formed in the first insulating layer 43. Electrodes 45 are electrically connected to regions 42 on the other side through contact holes formed in the first insulating layer 43.

A second insulating layer 46 is formed on the first insulating layer 43, and second wirings 47 are electrically connected to the electrodes 45 through contact holes formed in this second insulating layer 46. This results in electrically connecting the regions 42 on the other side through the electrodes 45 to the second wirings 47.

A protective layer 48 is formed on the second insulating layer 46. The first insulating layer 43, the second insulating layer 46, and the protective layer 48 are made of $SiO_2$, SiN, or the like. The first wirings 44, electrodes 45, and second wirings 47 are made of such metal as Al.

Each first wiring 44 electrically connects regions 41 on one side in respective pixels $11_{mn}$ in the first direction, and is arranged to extend in the first direction between pixels $11_{mn}$. By connecting regions 41 on one side in the respective pixels $11_{mn}$ by the first wiring 44 in this manner, photosensitive portions $12_{mn}$ on one side (e.g., photosensitive portions $12_{11}$–$12_{1N}$ on one side) are electrically connected across a plurality of pixels $11_{11}$–$11_{1N}$, $11_{21}$–$11_{2N}$, . . . , $11_{M1}$–$11_{MN}$ arrayed in the first direction in the two-dimensional array, to constitute a photosensitive part extending long in the first direction in the photosensitive region 10. This photosensitive part extending long in the first direction is formed in each of M columns.

Each second wiring 47 electrically connects regions 42 on the other side in respective pixels $11_{mn}$ in the second direction, and is arranged to extend in the second direction between pixels $11_{mn}$. By connecting regions 42 on the other side in the respective pixels $11_{mn}$ by the second wiring 47 in this manner, photosensitive portions $13_{mn}$ on the other side (e.g., photosensitive portions $13_{11}$–$13_{M1}$ on the other side) are electrically connected across a plurality of pixels $11_{11}$–$11_{M1}$, $11_{12}$–$11_{M2}$, . . . , $11_{1N}$–$11_{MN}$ arrayed in the second direction in the two-dimensional array, to constitute a photosensitive part extending long in the second direction in the photosensitive region 10. This photosensitive part extending long in the second direction is formed in each of N rows.

In the photosensitive region 10 there are the M columns of photosensitive parts extending long in the first direction and the N rows of photosensitive parts extending long in the second direction, formed on an identical plane.

The shape of regions 41, 42 does not have to be limited to the approximately triangular shape shown in FIG. 2, but may be any other shape, as shown in FIGS. 4 to 8.

Figure 4:
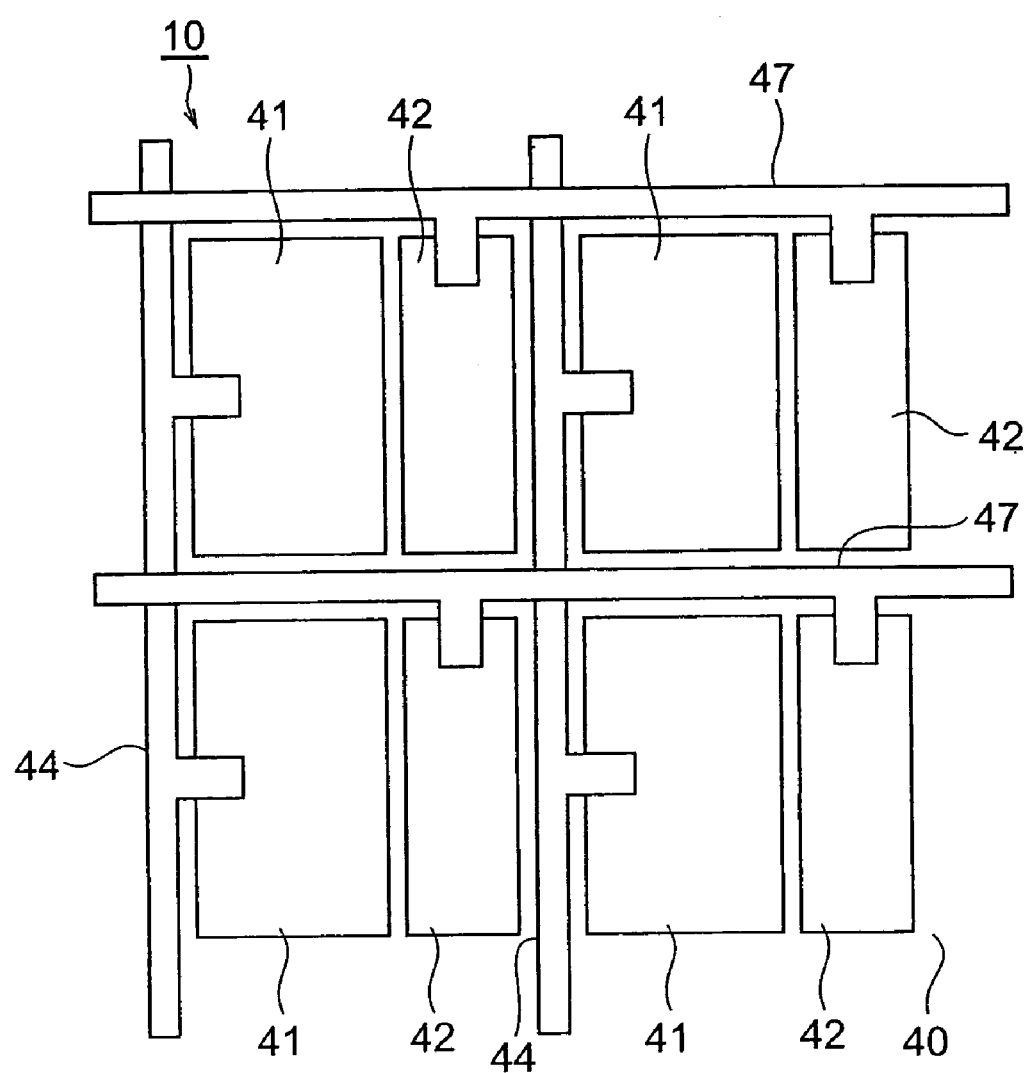
FIG. 4 is an enlarged plan view of major part showing an example of a photosensitive region included in the photodetector according to the embodiment of the present invention.

The second conductivity type semiconductor regions (photosensitive portions) shown in FIG. 4 are of rectangular shape, when viewed from the light-incident direction, and in each pixel two regions 41, 42 are formed adjacent on the longer side to each other. The regions 41 (photosensitive portions $12_{mn}$) and the regions 42 (photosensitive portions $13_{mn}$) are alternately arrayed in the second direction. The areas of the second conductivity type semiconductor regions in the first direction and in the second direction per pixel may be different from each other if the areas are constant in each of the directions among the pixels, as shown in FIG. 4. Namely, the point is that the total area is kept constant for photosensitive regions connected to each of all the wirings extending in the same direction.

Figure 5:
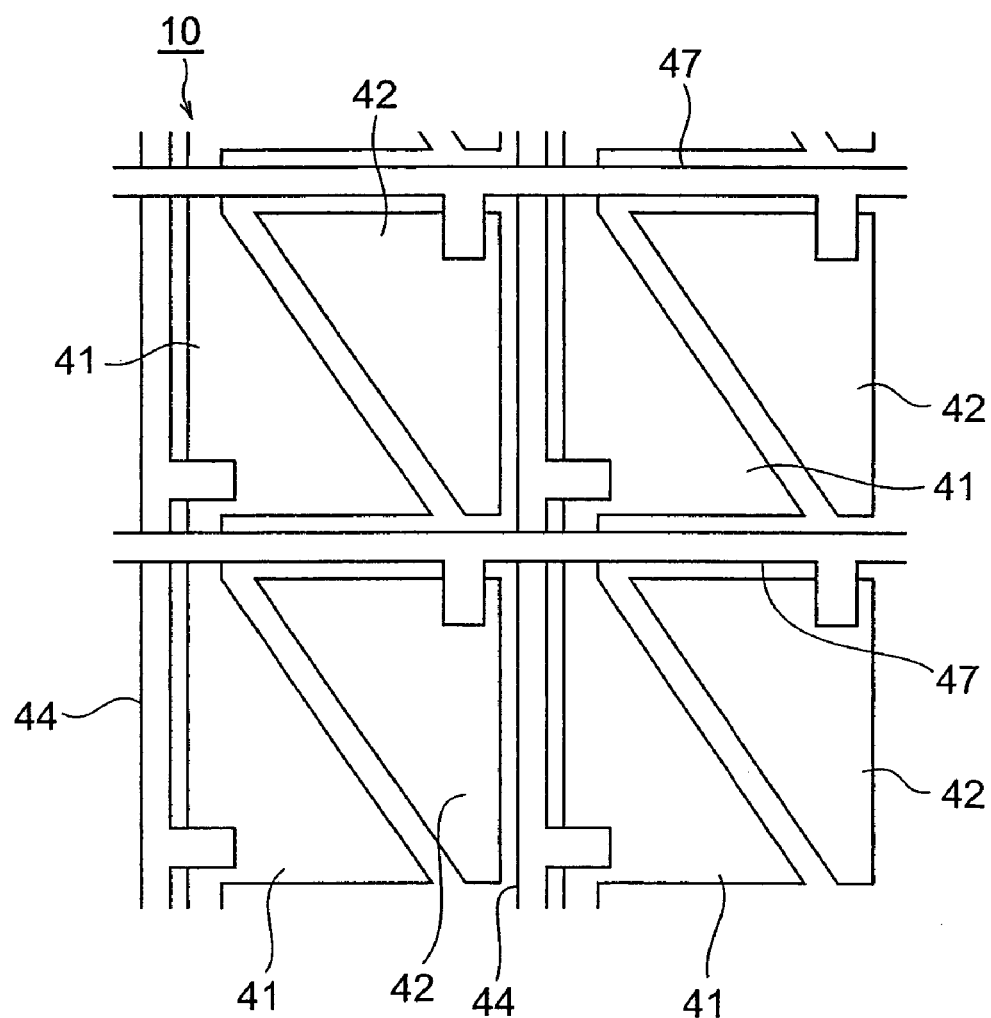
FIG. 5 is an enlarged plan view of major part showing an example of a photosensitive region included in the photodetector according to the embodiment of the present invention.

The second conductivity type semiconductor regions (photosensitive portions) shown in FIG. 5 include regions 41 of approximately triangular shape on one side continuously formed in the first direction. The regions 42 on the other side are of approximately triangular shape and are formed independently of each other among the pixels $11_{mn}$. The regions 41 (photosensitive portions $12_{mn}$) and the regions 42 (photosensitive portions $13_{mn}$) are alternately arrayed in the second direction. In the case where the regions 41 on one side are continuously formed in the first direction, the first wirings 44 are not always necessary. However, it can possibly result in increase of series resistance and, in turn, decrease of readout speed, and it is thus preferable to provide the first wirings 44 for electrically connecting the regions 41.

Figure 6:
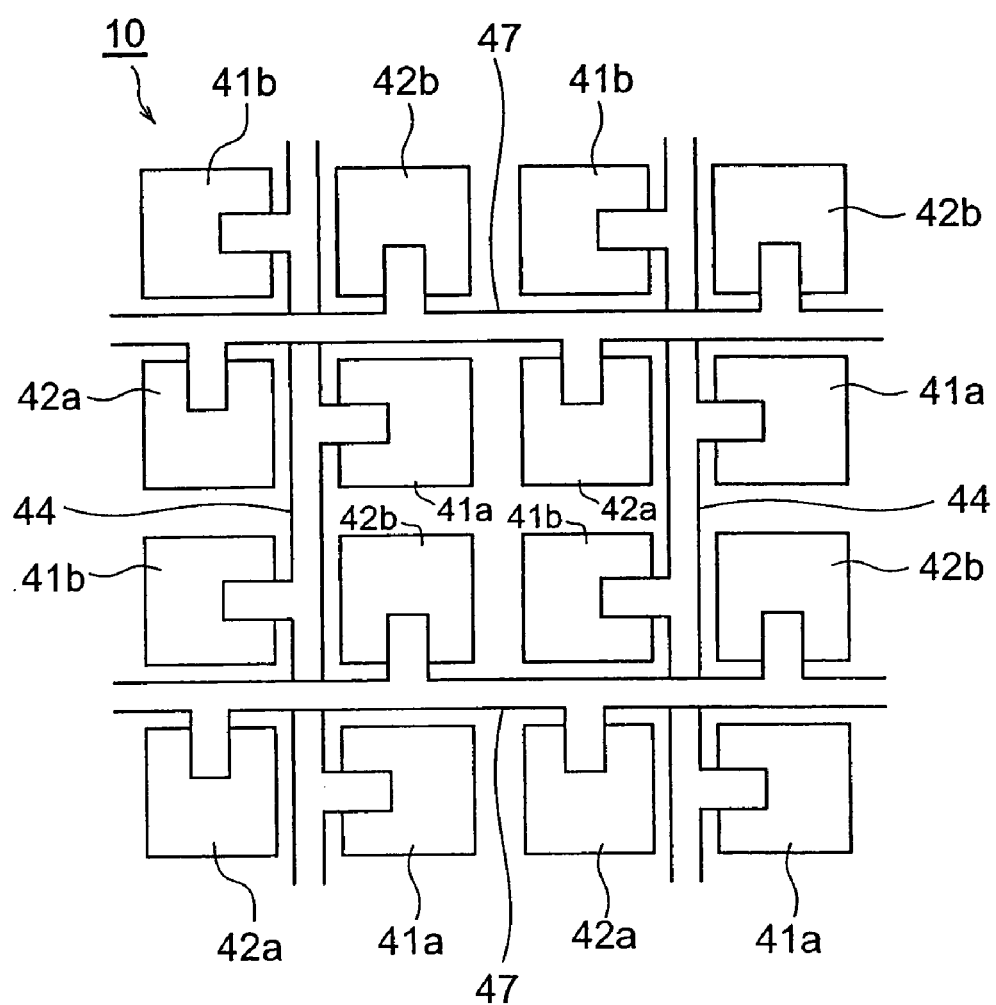
FIG. 6 is an enlarged plan view of major part showing an example of a photosensitive region included in the photodetector according to the embodiment of the present invention.

The second conductivity type semiconductor regions (photosensitive portions) shown in FIG. 6 consist of four regions 41a, 41b, 42a, and 42b per pixel, and are electrically connected by first wiring 44 or second wiring 47, while diagonally located regions are paired. The regions 41 (photosensitive portions $12_{mn}$) and the regions 42 (photosensitive portions $13_{mn}$) are alternately arrayed in the first direction and in the second direction. In addition, the regions 41 (photosensitive portions $12_{mn}$) and the regions 42 (photosensitive portions $13_{mn}$) are alternately arrayed in the third direction and in the fourth direction.

Figure 7:
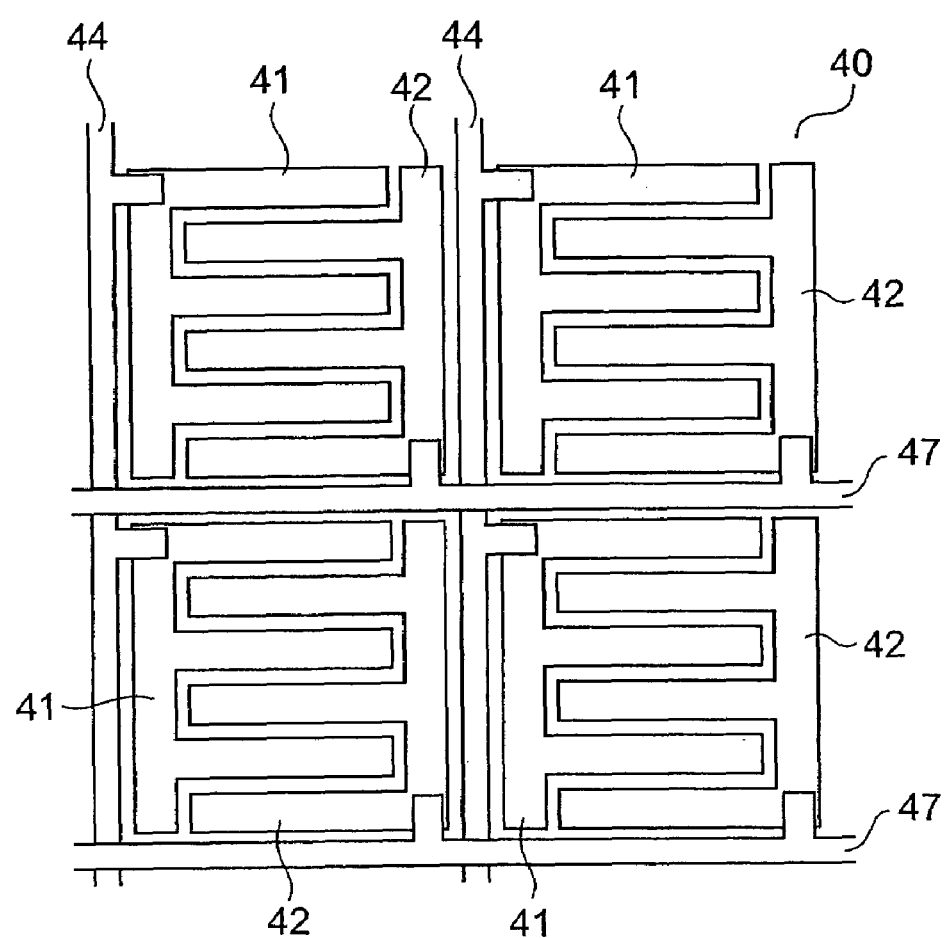
FIG. 7 is an enlarged plan view of major part showing an example of a photosensitive region included in the photodetector according to the embodiment of the present invention.

The second conductivity type semiconductor regions (photosensitive portions) shown in FIG. 7 are formed so that two pectinate regions 41, 42 are in mesh with each other.

Figure 8:
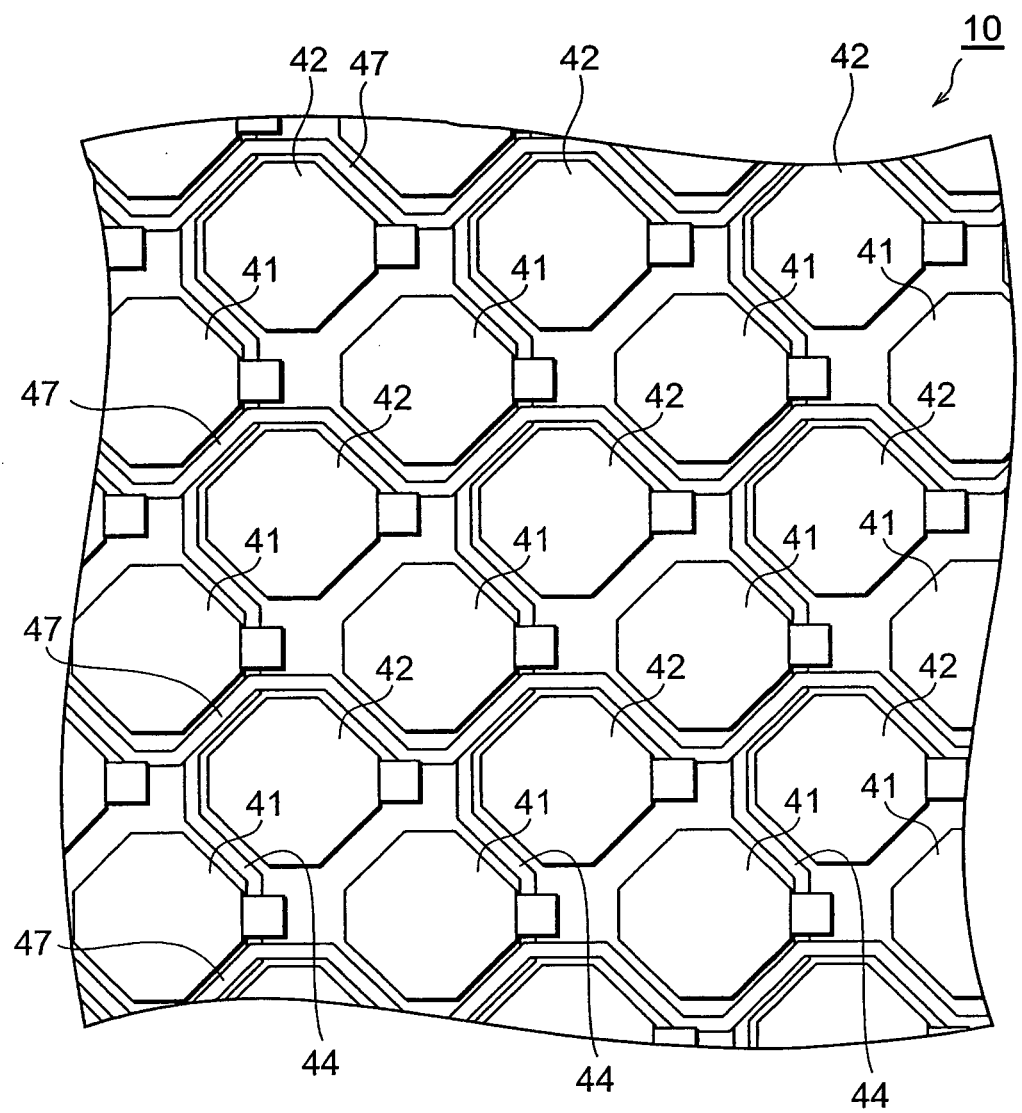
FIG. 8 is an enlarged plan view of major part showing an example of a photosensitive region included in the photodetector according to the embodiment of the present invention.

The second conductivity type semiconductor regions (photosensitive portions) shown in FIG. 8 are of four or more-sided polygonal shape (e.g., octagon), when viewed from the light-incident direction, and in each pixel they are formed adjacent on one side to each other. The regions 41 and 42 are juxtaposed in the third direction intersecting with the first direction and with the second direction in each pixel, and they are arrayed in honeycomb structure when viewed from the light-incident direction. Namely, the regions 41 (photosensitive portions $12_{mn}$) and the regions 42 (photosensitive portions $13_{mn}$) are alternately arrayed in the third direction and in the fourth direction.

Figure 9:
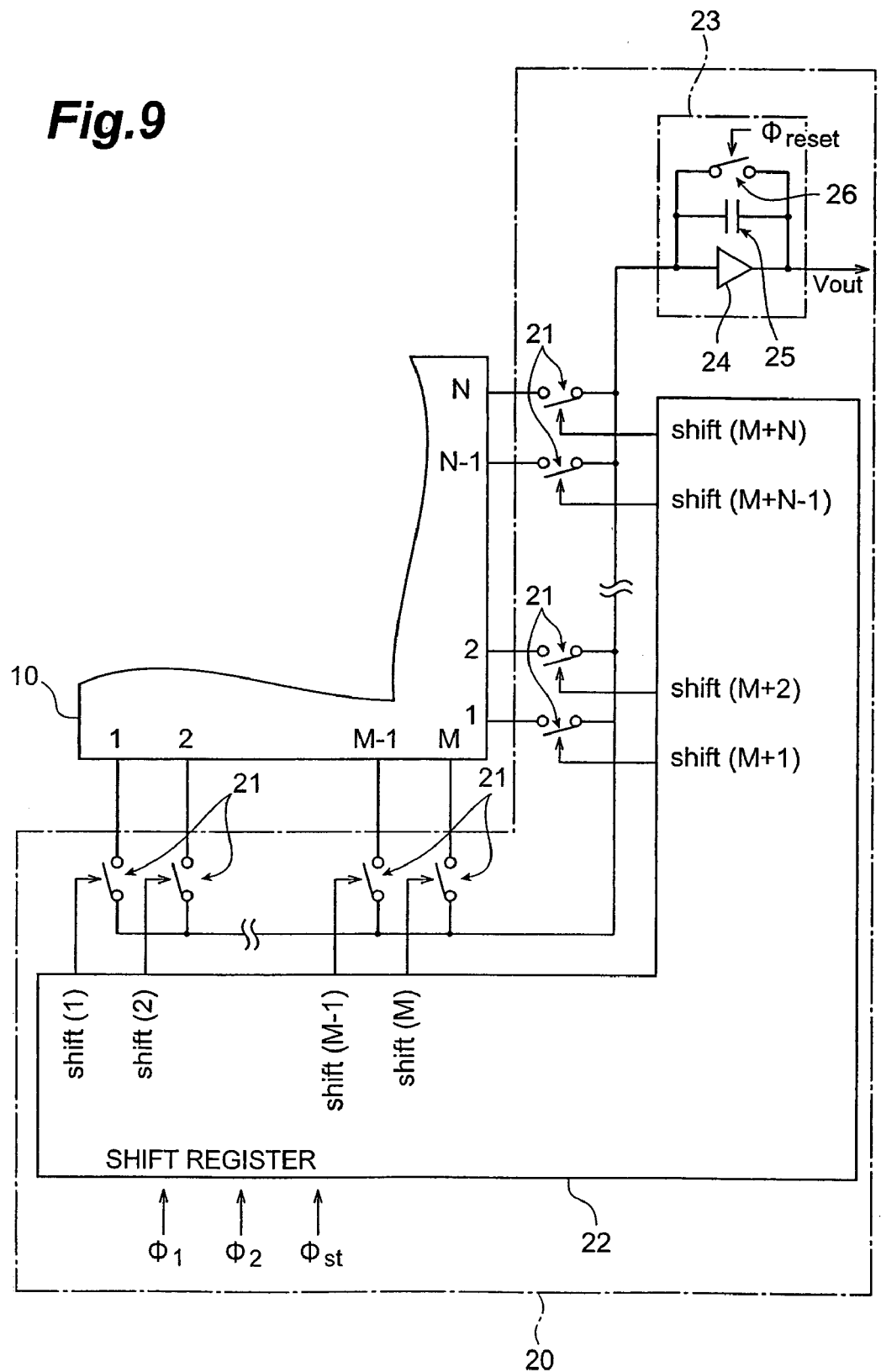
FIG. 9 is a schematic configuration diagram showing a signal processing circuit included in the photodetector according to the embodiment of the present invention.

Subsequently, the configuration of the signal processing circuit 20 will be described on the basis of FIG. 9. FIG. 9 is a schematic configuration diagram showing the signal processing circuit.

The signal processing circuit 20 is a circuit for detecting the luminance profiles in the second direction and the luminance profiles in the first direction of light incident to the photosensitive region 10, and outputs voltages $V_{out}$ indicating the luminance profiles in the second direction and in the first direction.

The signal processing circuit 20 has switches 21, a shift register 22, and an integrating circuit 23, as shown in FIG. 9. The switches 21 are provided corresponding to the groups of photosensitive portions $12_{mn}$ on one side electrically connected among a plurality of pixels $11_{11}$–$11_{1N}$, $11_{21}$–$11_{2N}$, . . . , $11_{M1}$–$11_{MN}$ arrayed in the first direction (M columns of photosensitive parts comprised of second conductivity type semiconductor regions 41 on one side and extending long in the first direction) and corresponding to the groups of photosensitive portions $13_{mn}$ on the other side electrically connected among a plurality of pixels $11_{11}$–$11_{M1}$, $11_{12}$–$11_{M2}$, . . . , $11_{1N}$–$11_{MN}$ arrayed in the second direction (N rows of photosensitive parts comprised of second conductivity type semiconductor regions 42 on the other side and extending long in the second direction). The shift register 22 is a device for sequentially reading in the second direction, electric currents from the groups of photosensitive portions $12_{mn}$ on one side electrically connected among the plurality of pixels $11_{11}$–$11_{1N}$, $11_{21}$–$11_{2N}$, . . . , $11_{M1}$–$11_{MN}$ arrayed in the first direction and for sequentially reading in the first direction, electric currents from the groups of photosensitive portions $13_{mn}$ on the other side electrically connected among the plurality of pixels $11_{11}$–$11_{M1}$, $11_{12}$–$11_{M2}$, . . . , $11_{1N}$–$11_{MN}$ arrayed in the second direction. The integrating circuit 23 sequentially imports the electric currents from the respective groups of photosensitive portions $12_{mn}$ on one side and the electric currents from the respective groups of photosensitive portions $13_{mn}$ on the other side sequentially read by the shift register 22, and converts the electric currents into voltages.

The switches 21 are controlled by signals shift(m), shift (M+n) outputted from the shift register 22, to be sequentially closed. As the switches 21 are closed, charges accumulated in the groups of photosensitive portions $12_{mn}$ on one side electrically connected among the plurality of pixels $11_{11}$–$11_{1N}$, $11_{21}$–$11_{2N}$, . . . , $11_{M1}$–$11_{MN}$ arrayed in the first direction are outputted in the form of an electric current through the first wiring 44 and switch 21 to the integrating circuit 23. As the switches 21 are closed, charges accumulated in the groups of photosensitive portions $13_{mn}$ on the other side electrically connected among the plurality of pixels $11_{11}$–$11_{M1}$, $11_{12}$–$11_{M2}$, . . . , $11_{1N}$–$11_{MN}$ arrayed in the second direction are outputted in the form of an electric current through the second wiring 47 and switch 21 to the integrating circuit 23. The shift register is controlled in its operation by signals $\Phi_1$, $\Phi_2$, $\Phi_{st}$ outputted from a control circuit (not shown), to sequentially close the switches 21.

The integrating circuit 23 includes an amplifier 24, a capacitor 25, and a switch 26. The amplifier 24 imports the electric currents from the groups of photosensitive portions $12_{mn}$ on one side electrically connected among the plurality of pixels $11_{11}$–$11_{1N}$, $11_{21}$–$11_{2N}$, ..., $11_{M1}$–$11_{MN}$ arrayed in the first direction and the electric currents from the groups of photosensitive portions $13_{mn}$ on the other side electrically connected among the plurality of pixels $11_{11}$–$11_{M1}$, $11_{12}$–$11_{M2}$, ..., $11_{1N}$–$11_{MN}$ arrayed in the second direction, and amplifies the charges of the input electric currents. The capacitor 25 is connected at one terminal to an input terminal of the amplifier 24, and is connected at the other terminal to an output terminal of the amplifier 24. The switch 26 is connected at one terminal to the input terminal of the amplifier 24 and connected at the other terminal to the output terminal of the amplifier 24, and turns into an "ON" state with a reset signal $\Phi_{reset}$ from the control circuit being High, or turns into an "OFF" state with the reset signal $\Phi_{reset}$ being Low.

While the switch 26 is in the "ON" state, the integrating circuit 23 discharges electricity from the capacitor 25 to initialize it. On the other hand, while the switch 26 is in the "OFF" state, the integrating circuit 23 accumulates in the capacitor 25, the charge fed to the input terminal from each of the groups of photosensitive portions $12_{mn}$ on one side electrically connected among the plurality of pixels $11_{11}$–$11_{1N}$, $11_{21}$–$11_{2N}$, ..., $11_{M1}$–$11_{MN}$ arrayed in the first direction and the groups of photosensitive portions $13_{mn}$ on the other side electrically connected among the plurality of pixels $11_{11}$–$11_{M1}$, $11_{12}$–$11_{M2}$, ..., $11_{1N}$–$11_{MN}$ arrayed in the second direction, and outputs the voltage $V_{out}$ according to the accumulated charge, from the output terminal.

Figure 10:
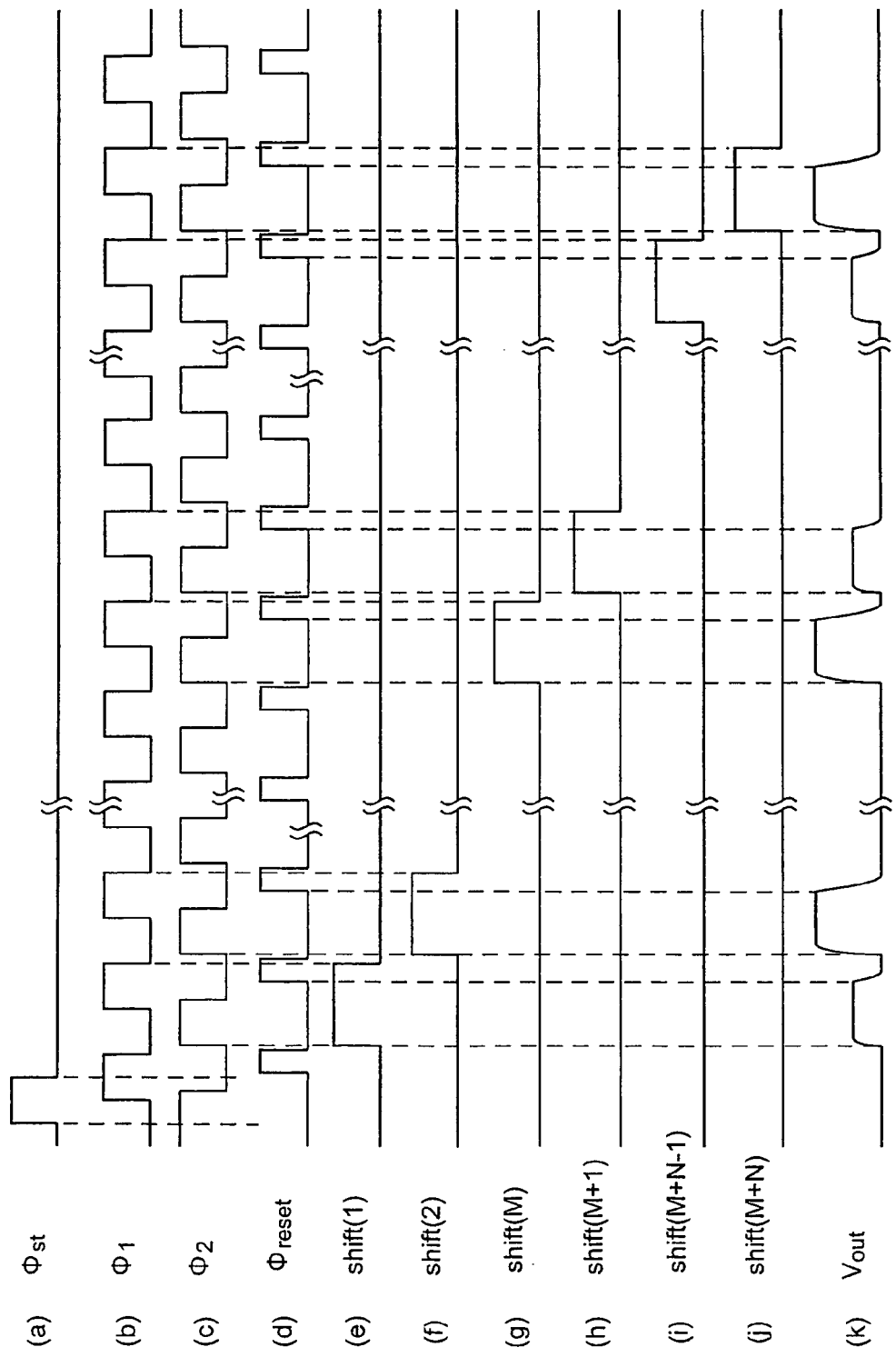
FIG. 10 is a timing chart for explaining the operation of the signal processing circuit.

Subsequently, the operation of signal processing circuit 20 will be described on the basis of FIG. 10. FIG. 10 is a timing chart for explaining the operation of the signal processing circuit.

In FIG. 10, when the shift register 22 receives a start signal $\Phi_{st}$ from the control circuit, it sequentially outputs the signals shift (m), shift (M+n) with a pulse width corresponding to a duration between a rise of signal $\Phi_2$ and a fall of signal $\Phi_1$. As the shift register 22 outputs shift (m), shift (M+n) to the corresponding switches 21, the switches 21 are sequentially closed, whereupon charges stored in the corresponding groups of photosensitive portions $12_{mn}$ on one side and groups of photosensitive portions $13_{mn}$ on the other side are sequentially outputted in the form of an electric current to the integrating circuit 23.

The integrating circuit 23 receives the reset signal $\Phi_{reset}$ from the control circuit, and accumulates in the capacitor 25 the charges accumulated in the corresponding groups of photosensitive portions $12_{mn}$ on one side and groups of photosensitive portions $13_{mn}$ on the other side during periods of the reset signal $\Phi_{reset}$ in the "OFF" state, and the integrating circuit 23 sequentially outputs the voltages $V_{out}$ according to amounts of the accumulated charges. When the reset signal $\Phi_{reset}$ is in the "ON" state, the integrating circuit 23 closes the switch 26 to initialize the capacitor 25.

In this manner, the signal processing circuit 20 sequentially outputs the voltages $V_{out}$ corresponding to the charges (electric currents) accumulated in the groups of photosensitive portions $12_{mn}$ on one side electrically connected among the plurality of pixels $11_{11}$–$11_{1N}$, $11_{21}$–$11_{2N}$, ..., $11_{M1}$–$11_{MN}$ arrayed in the first direction and the charges (electric currents) accumulated in the groups of photosensitive portions $13_{mn}$ on the other side electrically connected among the plurality of pixels $11_{11}$–$11_{M1}$, $11_{12}$–$11_{M2}$, ..., $11_{1N}$–$11_{MN}$ arrayed in the second direction, in the form of time-series data for each of the corresponding groups of photosensitive portions $12_{mn}$ on one side and groups of photosensitive portions $13_{mn}$ on the other side. This time-series data indicates the luminance profiles in the second direction and the luminance profiles in the first direction.

In the photodetector 1 of the present embodiment, as described above, light incident on one pixel $11_{mn}$ enters each of the plurality of photosensitive portions $12_{mn}$, $13_{mn}$ forming the pixel $11_{mn}$, whereupon an electric current according to an intensity of the light is outputted from each of the photosensitive portions $12_{mn}$, $13_{mn}$. Since the photosensitive portions $12_{mn}$ on one side are electrically connected to each other across the plurality of pixels $11_{11}$–$11_{1N}$, $11_{21}$–$11_{2N}$, ..., $11_{M1}$–$11_{MN}$ arrayed in the first direction in the two-dimensional array, the electric current outputted from the photosensitive portions $12_{mn}$ on one side is fed in the first direction. Since the photosensitive portions $13_{mn}$ on the other side are electrically connected to each other across the plurality of pixels $11_{11}$–$11_{M1}$, $11_{12}$–$11_{M2}$, ..., $11_{1N}$–$11_{MN}$ arrayed in the second direction in the two-dimensional array, the electric current outputted from the photosensitive portions $13_{mn}$ on the other side are fed in the second direction. In this manner, the electric current outputted from the photosensitive portions $12_{mn}$ on one side is fed in the first direction and the electric current outputted from the photosensitive portions $13_{mn}$ on the other side is fed in the second direction; therefore, it enables the luminance profiles in the first direction and the luminance profiles in the second direction to be obtained independently of each other. In consequence, the two-dimensional position of incident light can be quickly detected by the extremely simple configuration wherein a plurality of photosensitive portions $12_{mn}$, $13_{mn}$ are provided in each pixel.

In the photodetector 1 of the present embodiment, each photosensitive portion $12_{mn}$, $13_{mn}$ includes a part of semiconductor substrate 40 and second conductivity type semiconductor regions 41, 42, the second conductivity type semiconductor regions 41, 42 are of approximately triangular shape when viewed from the light-incident direction, and they are formed adjacent on one side to each other in each pixel. This makes it feasible to suppress reduction of the area of each photosensitive portion $12_{mn}$, $13_{mn}$ (second conductivity type semiconductor region 41, 42) in the arrangement of multiple photosensitive portions $12_{mn}$, $13_{mn}$ in each pixel.

In the photodetector 1 of the present embodiment, the second conductivity type semiconductor regions 41, 42 are of approximately rectangular shape when viewed from the light-incident direction, and are formed adjacent on the longer side to each other in each pixel. This makes it feasible to suppress reduction of the area of each photosensitive portion $12_{mn}$, $13_{mn}$ (second conductivity type semiconductor region 41, 42) in the arrangement of multiple photosensitive portions $12_{mn}$, $13_{mn}$ in each pixel.

In the photodetector 1 of the present embodiment, the second conductivity type semiconductor regions 41, 42 are of four or more-sided polygonal shape when viewed from the light-incident direction, and are formed adjacent on one side to each other in each pixel. This makes it feasible to suppress reduction of the area of each photosensitive portion $12_{mn}$, $13_{mn}$ in the arrangement of multiple photosensitive portions $12_{mn}$, $13_{mn}$ (second conductivity type semiconductor regions 41, 42) in each pixel. The circumferential length decreases relative to the area of each photosensitive portion $12_{mn}$, $13_{mn}$, and it results in decreasing a reduced dark current per unit area. The rhombus shape may be adopted as the four or more-sided polygonal shape.

In the photodetector 1 of the present embodiment, the second conductivity type semiconductor regions 41, 42 are juxtaposed in the third direction intersecting with the first direction and with the second direction in each pixel. This results in concentrating the photosensitive portions $12_{mn}$, $13_{mn}$ corresponding to the central portions of the groups of respective photosensitive portions $12_{mn}$, $13_{mn}$ in the groups of photosensitive portions $12_{mn}$ on one side and in the groups of photosensitive portions $13_{mn}$ on the other side, whereby the resolution can be improved.

In another configuration, the second conductivity type semiconductor regions 41, 42 are arrayed in honeycomb structure when viewed from the light-incident direction. This makes it feasible to further suppress the reduction of the area of each photosensitive portion $12_{mn}$, $13_{mn}$ the arrangement of multiple photosensitive portions $12_{mn}$, $13_{mn}$ (second conductivity type semiconductor regions 41, 42) in each pixel. This structure has high geometric symmetry and suppresses nonuniformity due to positional deviation of a mask used for formation of the second conductivity type semiconductor regions 41, 42 (photosensitive portions $12_{mn}$, $13_{mn}$).

In the photodetector 1 of the present embodiment, the first wirings 44 are provided so as to extend in the first direction between the pixels $11_{mn}$ and the second wirings 47 are provided so as to extend in the second direction between the pixels $11_{mn}$. This prevents each of the wirings 44, 47 from blocking incidence of light into the photosensitive portions $12_{mn}$, $13_{mn}$ (second conductivity type semiconductor regions 41, 42), and it is thus feasible to suppress degradation of detection sensitivity.

In the photodetector 1 of the present embodiment, one signal processing circuit 20 detects each of the luminance profiles in the first direction and the luminance profiles in the second direction. Since the common circuit is used as a circuit for processing the electric currents from the groups of photosensitive portions $12_{mn}$ on one side and as a circuit for processing the electric currents from the groups of photosensitive portions $13_{mn}$ on the other side, the circuit area can be reduced, so as to achieve cost reduction.

The photodetector 1 of the present embodiment has the shift register 22 and the integrating circuit 23. This enables the apparatus to obtain the luminance profiles in the first direction and the luminance profiles in the second direction by the extremely simple configuration.

Figure 11:
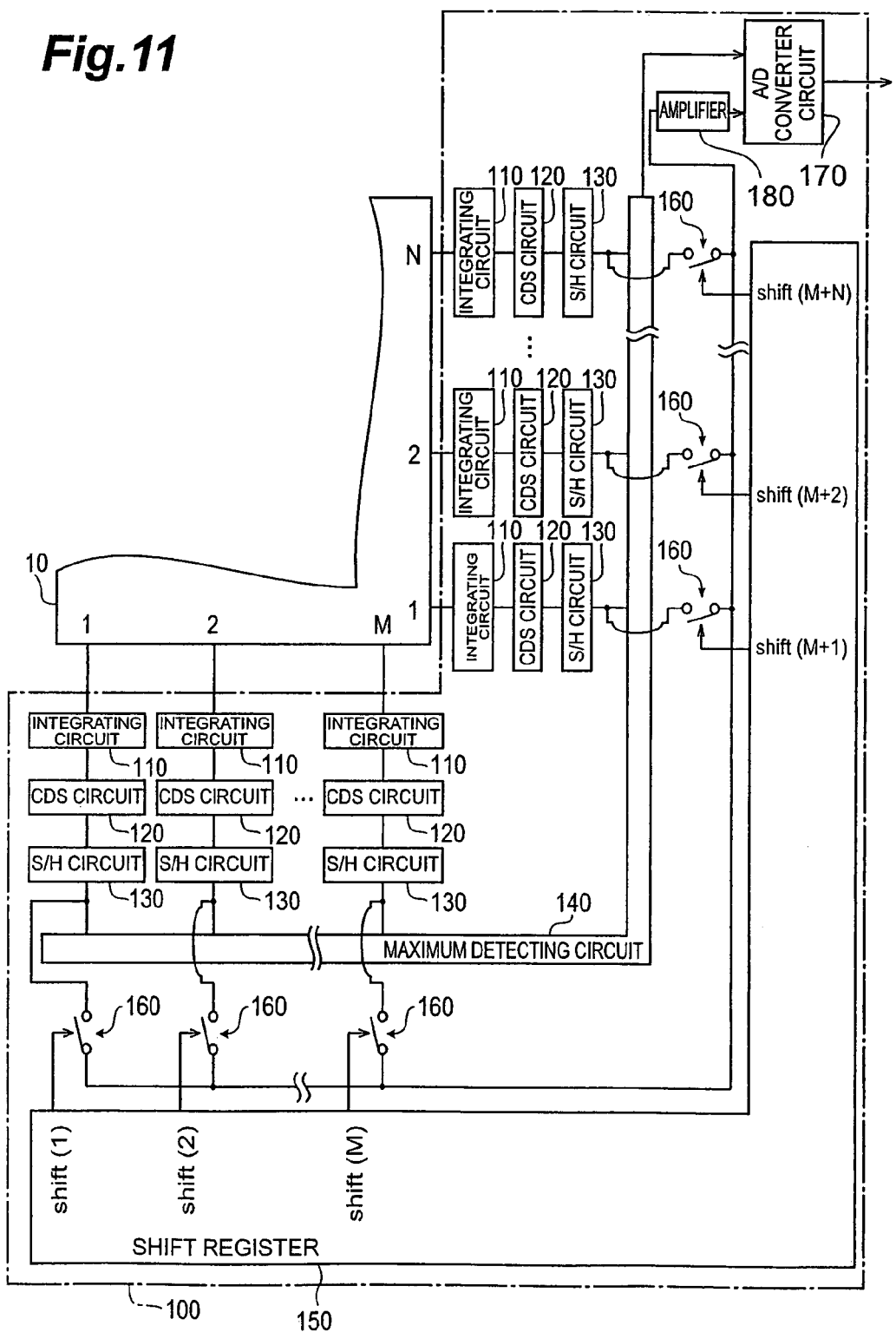
FIG. 11 is a schematic configuration diagram showing a modification example of the signal processing circuit included in the photodetector according to the embodiment of the present invention.

Next, a configuration of a modification example of the signal processing circuit will be described on the basis of FIG. 11. FIG. 11 is a schematic configuration diagram showing the modification example of the signal processing circuit.

The signal processing circuit 100, as shown in FIG. 11, has integrating circuits 110, CDS circuits 120, sample-and-hold circuits (hereinafter referred to as S/H circuits) 130, a maximum detecting circuit 140, a shift register 150, switches 160, and an A/D converter circuit 170.

Figure 12:
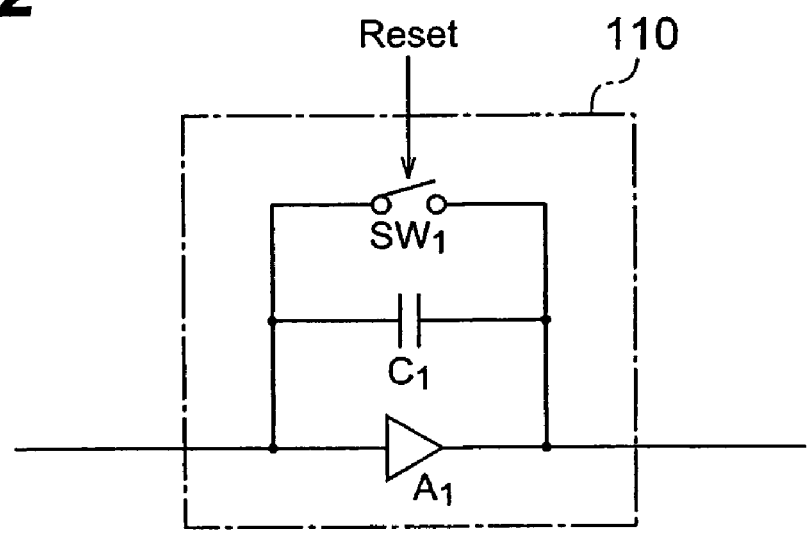
FIG. 12 is a circuit diagram of an integrating circuit included in the modification example of the signal processing circuit.

The integrating circuits 110 are provided corresponding to the groups of photosensitive portions $12_{mn}$ on one side electrically connected among the plurality of pixels $11_{11}$–$11_{1N}$, $11_{21}$–$11_{2N}$, ..., $11_{M1}$–$11_{MN}$ arrayed in the first direction (the M columns of photosensitive parts comprised of second conductivity type semiconductor regions 41 on one side and extending long in the first direction) and corresponding to the groups of photosensitive portions $13_{mn}$ on the other side electrically connected among the plurality of pixels $11_{11}$–$11_{M1}$, $11_{12}$–$11_{M2}$, ..., $11_{1N}$–$11_{MN}$ arrayed in the second direction (the N rows of photosensitive parts comprised of second conductivity type semiconductor regions 42 on the other side and extending long in the second direction), and each integrating circuit 110 converts one of the electric currents from the corresponding groups of photosensitive portions $12_{mn}$ on one side and the electric currents from the corresponding groups of photosensitive portions 13, on the other side, into a voltage, and outputs the voltage. Each integrating circuit 110, as shown in FIG. 12, is comprised of an amplifier $A_1$, a capacitor $C_1$, and a switch $SW_1$ connected in parallel with each other between an input terminal and an output terminal. While the switch $SW_1$ is closed, the integrating circuit 110 discharges electricity from the capacitor $C_1$ to initialize it. On the other hand, while the switch $SW_1$ is open, the integrating circuit 110 accumulates a charge fed to the input terminal, in the capacitor $C_1$, and outputs a voltage according to the accumulated charge from the output terminal. The switch $SW_1$ is opened and closed on the basis of a Reset signal fed from the control circuit (not shown).

Figure 13:
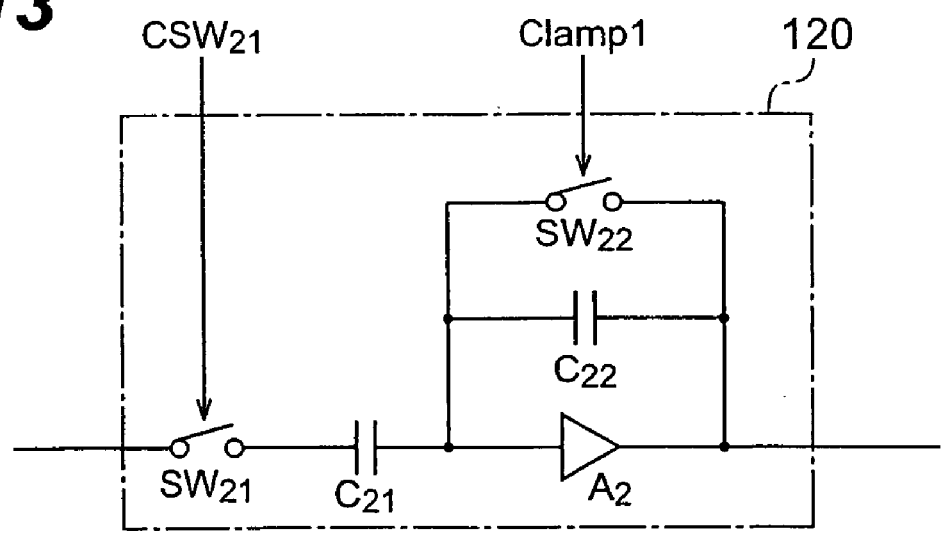
FIG. 13 is a circuit diagram of a CDS circuit included in the modification example of the signal processing circuit.

The CDS circuits 120 are provided corresponding to the integrating circuits 110, and each CDS circuit 120 outputs a voltage according to a variation amount in the voltage outputted from the corresponding integrating circuit 110. Each CDS circuit 120, as shown in FIG. 13, has a switch $SW_{21}$, a coupling capacitor $C_{21}$, and an amplifier $A_2$ in the order named between an input terminal and an output terminal. In addition, a switch $SW_{22}$ and an integral capacitor $C_{22}$ are connected in parallel with each other between the input and output of the amplifier $A_2$. The switch $SW_{22}$ and switch $SW_{21}$ act as switching means for letting the integral capacitor $C_{22}$ accumulate a charge. While the switch $SW_{22}$ is closed, the CDS circuit 120 discharges electricity from the integral capacitor $C_{22}$ to initialize it. While the switch $SW_{22}$ is open and the switch $SW_{21}$ is closed, a charge fed from the input terminal through the coupling capacitor $C_{21}$ is accumulated into the integral capacitor $C_{22}$, and a voltage according to the accumulated charge is outputted from the output terminal. The switch $SW_{21}$ is opened and closed on the basis of a $CSW_{21}$ signal outputted from the control circuit. The switch $SW_{22}$ is opened and closed on the basis of a Clamp1 signal outputted from the control circuit.

Figure 14:
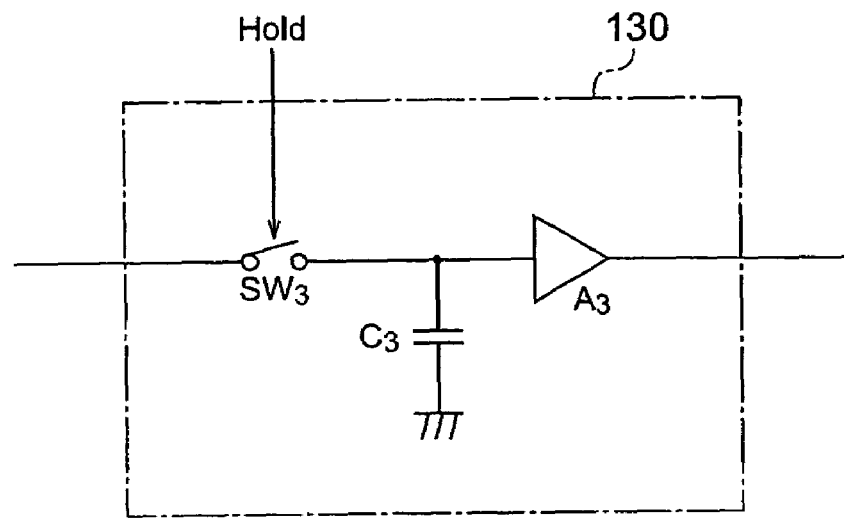
FIG. 14 is a circuit diagram of a sample-and-hold circuit included in the modification example of the signal processing circuit.

The S/H circuits 130 are provided corresponding to the CDS circuits 120, and each S/H circuit 130 holds and outputs the voltage outputted from the corresponding CDS circuit 120. Each S/H circuit 130, as shown in FIG. 14, has a switch $SW_3$ and an amplifier $A_3$ in the order named between an input terminal and an output terminal, and a connection point between the switch $SW_3$ and the amplifier $A_3$ is grounded through a capacitor $C_3$. While the switch $SW_3$ is closed, the S/H circuit 130 stores the voltage outputted from the CDS circuit 120, in the capacitor $C_3$, and holds the voltage in the capacitor $C_3$ even after the switch $SW_3$ is opened. The S/H circuit 130 outputs the voltage through the amplifier $A_3$. The switch $SW_3$ is opened and closed on the basis of a Hold signal outputted from the control circuit. The switches 160 are sequentially opened under control of the shift register 150 to sequentially feed the voltages outputted from the S/H circuits 130, to the A/D converter circuit.

Figure 15:
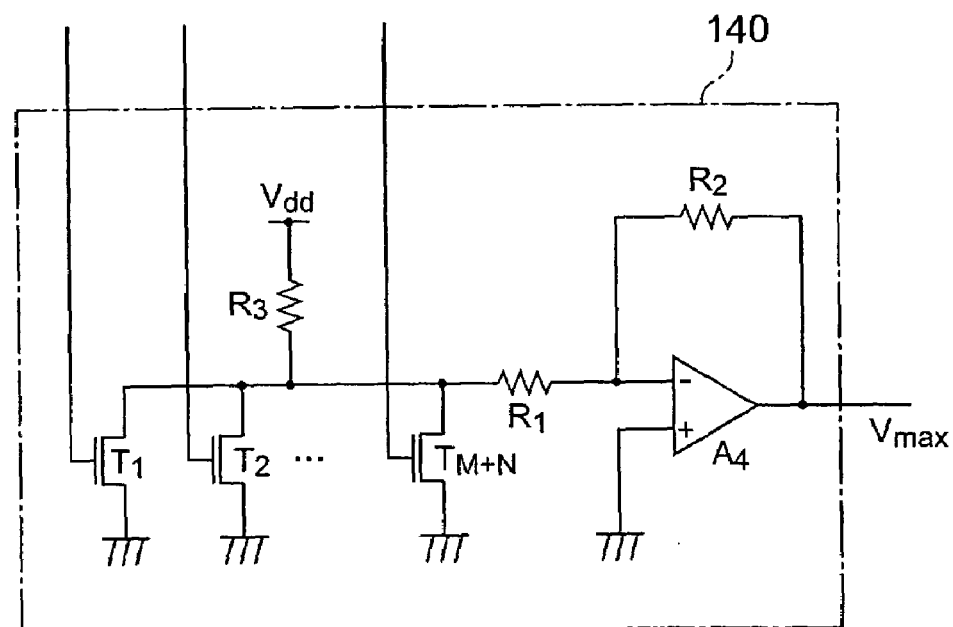
FIG. 15 is a circuit diagram of a maximum detecting circuit included in the modification example of the signal processing circuit.

The maximum detecting circuit 140 detects a maximum of the voltages outputted from the respective S/H circuits 130. The maximum detecting circuit 140, as shown in FIG. 15, has NMOS transistors $T_1$–$T_{M+N}$, resistors $R_1$–$R_3$, and a differential amplifier $A_4$. Source terminals of the respective transistors $T_1$–$T_{M+N}$ are grounded, and drain terminals of the respective transistors $T_1$–$T_{M+N}$ are connected through the resistor $R_3$ to a supply voltage $V_{dd}$ and connected through the resistor $R_1$ to an inverting input terminal of the differential amplifier $A_4$. A gate terminal of each transistor $T_1$–$T_{M+N}$ is connected to the output terminal of S/H circuit 130 and imports the voltage outputted from the S/H circuit 130. The resistor $R_2$ is provided between the inverting input terminal and the output terminal of the differential amplifier $A_4$, and a noninverting input terminal of the differential amplifier $A_4$ is grounded. In this maximum detecting circuit 140, the voltages outputted from the S/H circuits 130 are fed to the gate terminals of the corresponding transistors $T_1$–$T_{M+N}$, and a potential according to the maximum out of the voltages appears at the drain terminals of the transistors $T_1$–$T_{M+N}$. Then the potential at the drain terminals is amplified at an amplification rate according to the ratio of resistances of the respective resistors $R_1$ and $R_2$ by the differential amplifier $A_4$, and the value of the amplified voltage is outputted as a maximum voltage $V_{max}$ from the output terminal to the A/D converter circuit 170.

Figure 16:
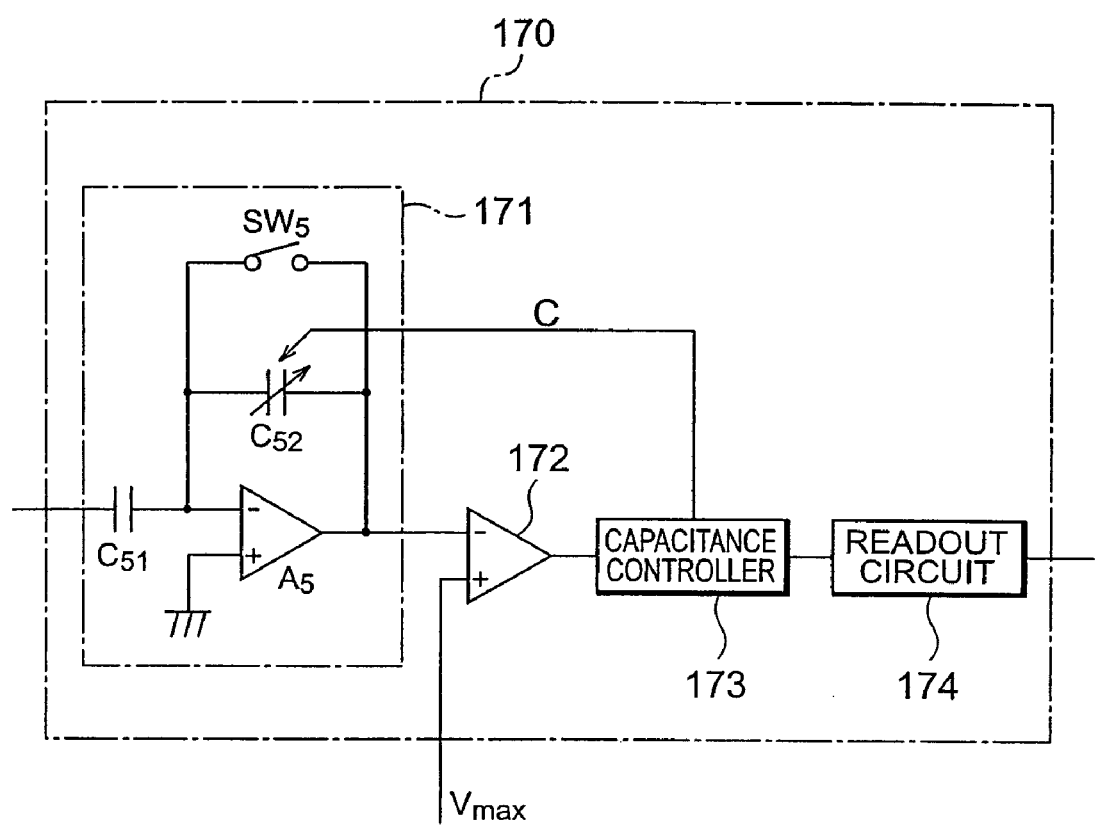
FIG. 16 is a circuit diagram of an A/D converter circuit included in the modification example of the signal processing circuit.

The A/D converter circuit 170 sequentially imports the voltages outputted from the respective S/H circuits 130, converts the voltages into digital values on the basis of the maximum detected by the maximum detecting circuit 140, and outputs the digital values. The A/D converter circuit 170 imports the maximum voltage $V_{max}$ outputted from the maximum detecting circuit 140, and defines this maximum voltage $V_{max}$ as an A/D conversion range. Then the A/D converter circuit 170 sequentially imports the voltages outputted from the S/H circuits 130 through the switches 160 and amplifier 180, converts the voltages (analog values) into digital values, and outputs the digital values. The A/D converter circuit 170, as shown in FIG. 16, has a variable capacitance integrating circuit 171, a comparator 172, a capacitance controller 173, and a readout circuit 174.

The variable capacitance integrating circuit 171 has a capacitor $C_{51}$, an amplifier $A_5$, a variable capacitor $C_{52}$, and a switch $SW_5$. The amplifier $A_5$ imports the voltages sequentially outputted from the S/H circuits 130 and arriving via the switches 160, through the capacitor $C_{51}$ to its inverting input terminal. A noninverting input terminal of the amplifier $A_5$ is grounded. The variable capacitor $C_{52}$ is variable and controllable in its capacitance, is provided between the inverting input terminal and the output terminal of the amplifier $A_5$, and accumulates a charge according to an input voltage. The switch $SW_5$ is provided between the inverting input terminal and the output terminal of the amplifier $A_5$, lets the variable capacitor $C_{52}$ accumulate a charge during opening of the switch $SW_5$, and resets the charge accumulation in the variable capacitor $C_{52}$ during closing. Then the variable capacitance integrating circuit 171 imports the voltages sequentially outputted from the S/H circuits 130, integrates them according to the capacitance of the variable capacitor $C_{52}$, and outputs voltages as results of the integration.

The comparator 172 imports each voltage from the variable capacitance integrating circuit 171 to its inverting input terminal, imports the maximum voltage $V_{max}$ from the maximum detecting circuit 140 to its noninverting input terminal, compares values of these two input voltages, and outputs a comparison result signal as a result of the comparison.

The capacitance controller 173 imports the comparison result signal outputted from the comparator 172, outputs a capacitance command signal C to control the capacitance of the variable capacitor $C_{52}$ on the basis of this comparison result signal, and outputs a first digital value according to the capacitance of the variable capacitor $C_{52}$ when it is determined that the value of the voltage as a result of the integration based on the comparison result signal and the maximum voltage $V_{max}$ agree with each other in a predetermined resolution.

The readout circuit 174 imports the first digital value outputted from the capacitance controller 173, and outputs a second digital value corresponding to this first digital value. The second digital value indicates a value obtained by subtracting an offset value of the variable capacitance integrating circuit 171 from the first digital value. The readout circuit 174 is, for example, a storage device, and it imports the first digital value as an address and outputs data stored at the address in the storage device, as the second digital value. The second digital values provide the output indicating the luminance profiles in the second direction and the luminance profiles in the first direction.

As described above, the maximum voltage $V_{max}$ outputted from the maximum detecting circuit 140 and fed into the comparator 172 defines the maximum of voltages or A/D conversion range where the A/D converter circuit 170 can perform A/D conversion without saturation. In addition, since at least one of the voltages fed to the A/D converter circuit 170 must be the maximum voltage $V_{max}$, the entire scope of the above A/D conversion range can be effectively utilized. Namely, the photodetector 1 of the present embodiment has excellent resolutions of A/D conversion not only at high intensities of light but also at low intensities of light.

In addition, even if each of the integrating circuits 110 has different noise variations depending upon the integrating operations, the CDS circuits 120 will eliminate noise error.

Since the integrating circuits 110 are provided corresponding to the respective groups of photosensitive portions $12_{mn}$, $13_{mn}$, charges can be accumulated at the same timing from the respective groups of photosensitive portions $12_{mn}$, $13_{mn}$, and amounts of those charges can be converted into voltages.

In consequence of these, it is feasible to accurately and quickly obtain the luminance profiles in the first direction and the luminance profiles in the second direction. The above operations of the integrating circuits 110, CDS circuits 120, S/H circuits 130, maximum detecting circuit 140, shift register 150, switches 160, A/D converter circuit 170, etc. are described, for example, in Japanese Patent Application Laid-Open No. 2001-36128 filed by Applicant.

The present invention is by no means limited to the above embodiments. For example, instead of use of the shift register, it is also possible to adopt a configuration wherein uniform resistance lines are used to connect the photosensitive portions $12_{mn}$, $13_{mn}$ (second conductivity type semiconductor regions 41, 42), charges generated with incidence of light are taken out from ends of the resistance lines, based on such resistance division as to establish inverse proportion to distances between positions of flow into the resistance lines and the ends of the respective resistance lines, and the position of incidence of light is determined based on electric currents from the ends.

Figure 17:
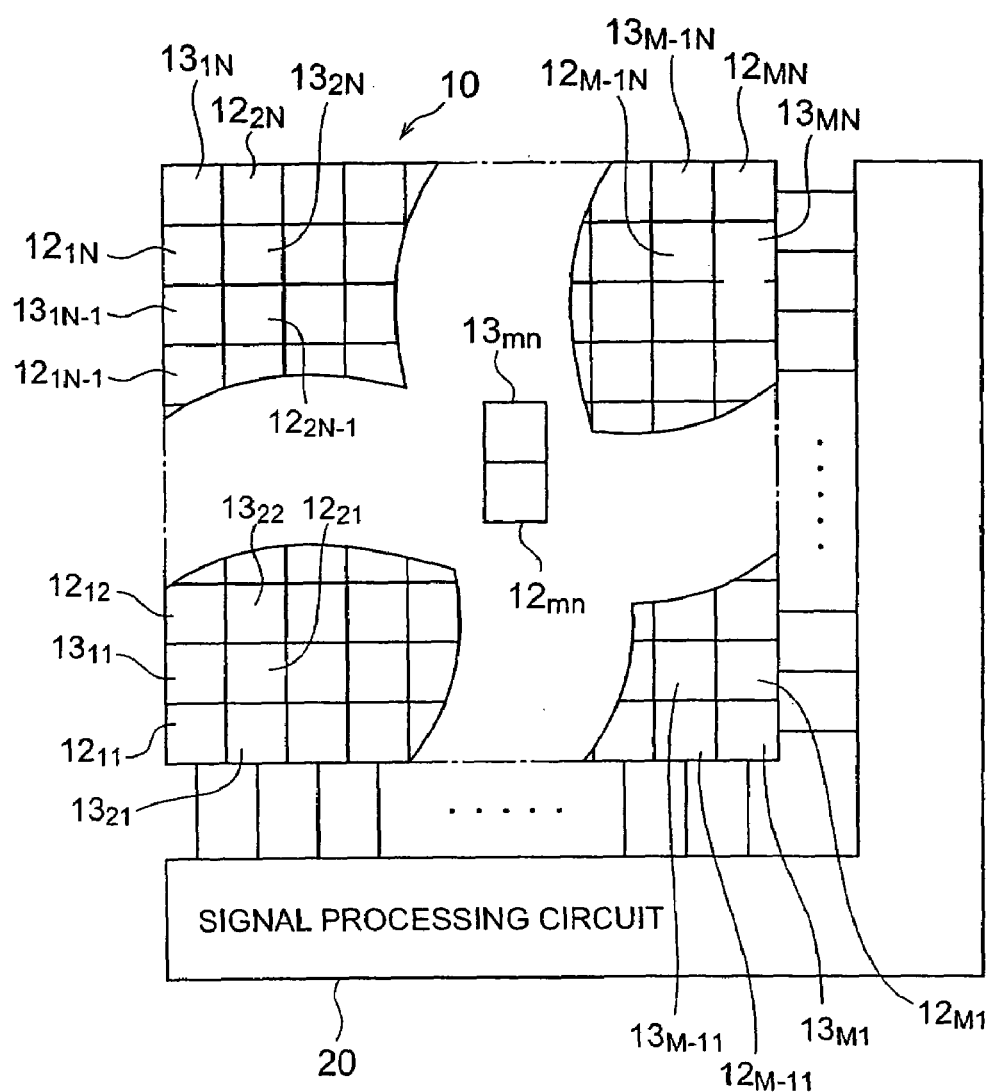
FIG. 17 is a schematic configuration diagram showing a modification example of the photodetector according to the embodiment of the present invention.

In the aforementioned embodiment, each pixel was comprised of a plurality of photosensitive portions, but each pixel may be comprised of one photosensitive portion. For example, as shown in FIG. 17, the photosensitive region 10 includes a plurality of first photosensitive portions $12_{mn}$ electrically connected to each other in the first direction and a plurality of second photosensitive portions $13_{mn}$ electrically connected to each other in the second direction, and the first photosensitive portions $12_{mn}$ and the second photosensitive portions $13_{mn}$ may be arrayed in a two-dimensionally mixed state in an identical plane. In this case, the first photosensitive portions $12_{mn}$ and the second photosensitive portions $13_{mn}$ are arrayed in a checkered pattern, and the first photosensitive portions $12_{mn}$ and the second photosensitive portions $13_{mn}$ are alternately arrayed in the first direction and in the second direction. The photosensitive portions may also be arrayed in the honeycomb structure as shown in FIG. 8, instead of the array of the checkered pattern.

INDUSTRIAL APPLICABILITY

The photodetector of the present invention is applicable to systems for detecting the incidence position of reflected light or direct light.

The invention claimed is:

1. A photodetector having a photosensitive region in which pixels are arranged in a two-dimensional array,
    wherein each pixel is constructed of a plurality of photosensitive portions each of which outputs an electric current according to an intensity of incident light and which are arranged adjacent to each other within an identical plane,
    wherein across a plurality of pixels arrayed in a first direction in the two-dimensional array, photosensitive portions on one side out of the plurality of photosensitive portions forming each of said pixels are electrically connected to each other,
    wherein across a plurality of pixels arrayed in a second direction in the two-dimensional array, photosensitive portions on another side out of the plurality of photosensitive portions forming each of said pixels are electrically connected to each other,
    the photodetector comprising a signal processing circuit for reading electric currents from groups of photosensitive portions on the one side electrically connected among the plurality of pixels arrayed in the first direction and electric currents from groups of photosensitive portions on the another side electrically connected among the plurality of pixels arrayed in the second direction, and for detecting luminance profiles in the first direction and in the second direction in the two-dimensional array on the basis of the electric currents.

2. The photodetector according to claim 1, wherein the signal processing circuit comprises:
    a shift register for sequentially reading the electric currents from the groups of photosensitive portions on the one side, in the second direction and for sequentially reading the electric currents from the groups of photosensitive portions on the another side, in the first direction; and
    an integrating circuit for sequentially importing the electric currents from the groups of photosensitive portions on the one side and the electric currents from the groups of photosensitive portions on the another side sequentially read by the shift register, and for converting the electric currents into voltages.

3. The photodetector according to claim 1, wherein the signal processing circuit comprises:
    integrating circuits provided corresponding to the groups of photosensitive portions on the one side and the groups of photosensitive portions on the another side, each of which converts either of an electric current from a corresponding group of photosensitive portions on the one side and an electric current from a corresponding group of photosensitive portions on the another side, into a voltage, and outputs the voltage;
    CDS circuits provided corresponding to the integrating circuits, each of which outputs a voltage according to a variation amount of the voltage outputted from a corresponding integrating circuit;
    sample-and-hold circuits provided corresponding to the CDS circuits, each of which holds a voltage outputted from a corresponding CDS circuit and outputs the voltage; and
    a maximum detecting circuit for detecting a maximum of voltages outputted from the respective sample-and-hold circuits; and
    an A/D converter circuit for sequentially importing the voltages outputted from the respective sample-and-hold circuits, converting the voltages into digital values on the basis of the maximum detected by the maximum detecting circuit, and outputting the digital values.

4. A photodetector having a photosensitive region,
    wherein the photosensitive region comprises a plurality of first photosensitive portions electrically connected to each other in a first direction and a plurality of second photosensitive portions electrically connected in a second direction intersecting with the first direction,
    wherein the plurality of first photosensitive portions and the plurality of second photosensitive portions are arrayed in a two-dimensionally mixed state within an identical plane, and
    the photodetector comprising a signal processing circuit for reading electric currents from groups of first photosensitive portions electrically connected to each other in the first direction and electric currents from groups of second photosensitive portions electrically connected to each other in the second direction, and for detecting luminance profiles in the first direction and in the second direction in the two-dimensional array on the basis of the electric currents.

5. The photodetector according to claim 4, wherein the signal processing circuit comprises:
    a shift register for sequentially reading the electric currents from the groups of first photosensitive portions in the second direction and for sequentially reading the electric currents from the groups of second photosensitive portions in the first direction; and
    an integrating circuit for sequentially importing the electric currents from the respective groups of first photosensitive portions and the electric currents from the respective groups of second photosensitive portions sequentially read by the shift register, and for converting the electric currents into voltages.

6. The photodetector according to claim 4, wherein the signal processing circuit comprises:
    integrating circuits provided corresponding to the groups of first photosensitive portions and the groups of second photosensitive portions, each of which converts either of an electric current from a corresponding group of first photosensitive portions and an electric current from a corresponding group of second photosensitive portions, into a voltage, and outputs a voltage;
    CDS circuits provided corresponding to the integrating circuits, each of which outputs a voltage according to a variation amount of the voltage outputted from a corresponding integrating circuit;
    sample-and-hold circuits provided corresponding to the CDS circuits, each of which holds a voltage outputted from a corresponding CDS circuit and outputs the voltage;
    a maximum detecting circuit for detecting a maximum of voltages outputted from the respective sample-and-hold circuits; and
    an A/D converter circuit for sequentially importing the voltages outputted from the respective sample-and-hold circuits, converting the voltages into digital values on the basis of the maximum detected by the maximum detecting circuit, and outputting the digital values.

* * * * *